(12) United States Patent
Izumi

(10) Patent No.: US 9,837,910 B2
(45) Date of Patent: Dec. 5, 2017

(54) AC-DC BI-DIRECTIONALLY CONVERSION DEVICE WITH FAILURE DETERMINATION FUNCTION, FAILURE DETERMINATION METHOD AND COMPUTER READABLE MEDIUM

(71) Applicants: Sumitomo Electric Industries, Ltd., Osaka-shi (JP); Sumitomo Wiring Systems, Ltd., Yokkaichi-shi (JP); AutoNetworks Technologies, Ltd., Yokkaichi-shi (JP)

(72) Inventor: Tatsuya Izumi, Osaka (JP)

(73) Assignees: Sumitomo Electric Industries, Ltd., Osaka-shi (JP); Sumitomo Wiring Systems, Ltd., Yokkaichi-shi (JP); AutoNetworks Technologies, Ltd., Yokkaichi-shi (JP)

( * ) Notice: Subject to any disclaimer, the term of this patent is extended or adjusted under 35 U.S.C. 154(b) by 0 days.

(21) Appl. No.: 14/760,962

(22) PCT Filed: Dec. 3, 2013

(86) PCT No.: PCT/JP2013/082436
§ 371 (c)(1),
(2) Date: Jul. 14, 2015

(87) PCT Pub. No.: WO2014/112225
PCT Pub. Date: Jul. 24, 2014

(65) Prior Publication Data
US 2015/0333637 A1   Nov. 19, 2015

(30) Foreign Application Priority Data
Jan. 15, 2013   (JP) ................................. 2013-004765

(51) Int. Cl.
*H02M 3/335* (2006.01)
*H02M 1/32* (2007.01)
(Continued)

(52) U.S. Cl.
CPC ........ *H02M 3/33507* (2013.01); *G01R 31/40* (2013.01); *H02J 7/0029* (2013.01);
(Continued)

(58) Field of Classification Search
CPC .... H02M 3/33507; H02M 1/32; H02M 7/219; H02M 2001/0009; H02M 2001/007
See application file for complete search history.

(56) References Cited

U.S. PATENT DOCUMENTS 6,671,144 B1 * 12/2003 Langford ............. H02H 1/0015
361/42
2008/0024535 A1 * 1/2008 Ito ........................ B41J 2/04518
347/11
(Continued)

FOREIGN PATENT DOCUMENTS

CN         102428640 A    4/2012
EP         2432112 A1     3/2012
(Continued)

OTHER PUBLICATIONS

International Search Report in PCT International Application No. PCT/JP2013/082436, dated Mar. 11, 2014.
(Continued)

*Primary Examiner* — Jue Zhang
*Assistant Examiner* — Lakaisha Jackson
(74) *Attorney, Agent, or Firm* — Venable LLP; Michael A. Sartori; Laura G. Remus

(57) ABSTRACT

Provided is a conversion device which can determine the presence/absence of a failure in a detection unit for detecting AC or DC voltage or current. A conversion device, including
(Continued)

an AC-DC conversion circuit, a DC-DC conversion circuit for converting DC voltage output from the AC-DC conversion circuit and a detection unit for detecting AC or DC voltage or current, comprises an obtaining part for obtaining information indicating whether or not AC voltage is applied to the AC-DC conversion circuit, and a power supply fault determination part for determination presence/absence of a power supply fault or an open fault in the detection unit if the obtained information indicates that AC voltage is not applied to the AC-DC conversion circuit.

10 Claims, 8 Drawing Sheets

(51) Int. Cl.
*H02M 7/219* (2006.01)
*H02J 7/00* (2006.01)
*G01R 31/40* (2014.01)
*H02M 1/00* (2006.01)
*G01R 31/00* (2006.01)
*G01R 31/02* (2006.01)

(52) U.S. Cl.
CPC ............ *H02M 1/32* (2013.01); *H02M 7/219* (2013.01); *G01R 31/007* (2013.01); *G01R 31/024* (2013.01); *H02M 2001/007* (2013.01); *H02M 2001/0009* (2013.01)

(56) References Cited

U.S. PATENT DOCUMENTS

| 2008/0238362 | A1 | 10/2008 | Pinnell et al. |
| 2008/0239593 | A1 | 10/2008 | Lavier et al. |
| 2009/0103341 | A1* | 4/2009 | Lee ................. B60W 10/26 363/124 |
| 2010/0202169 | A1* | 8/2010 | Gaboury ............ H02M 1/4225 363/49 |
| 2011/0238338 | A1* | 9/2011 | Iwashita ............... H02P 29/025 702/58 |
| 2012/0065936 | A1 | 3/2012 | Singamsetti |
| 2012/0074885 | A1 | 3/2012 | Hirono |
| 2012/0091954 | A1 | 4/2012 | Matsuki |
| 2012/0306516 | A1 | 12/2012 | Ueno |

FOREIGN PATENT DOCUMENTS

| JP | 11-069820 A | 3/1999 |
| JP | 2009-171644 A | 7/2009 |
| JP | 2010-104106 A | 5/2010 |
| JP | 2010-154616 A | 7/2010 |
| JP | 2010-178566 A | 8/2010 |
| JP | 2012-085378 A | 4/2012 |
| JP | 2012-251830 A | 12/2012 |

OTHER PUBLICATIONS

Extended European Search Report in counterpart European Patent Application No. 138719212, dated Nov. 17, 2016.
First Office Action in counterpart Chinese Patent Application No. 201380070394.1, dated Feb. 3, 2017.

* cited by examiner

F I G. 8
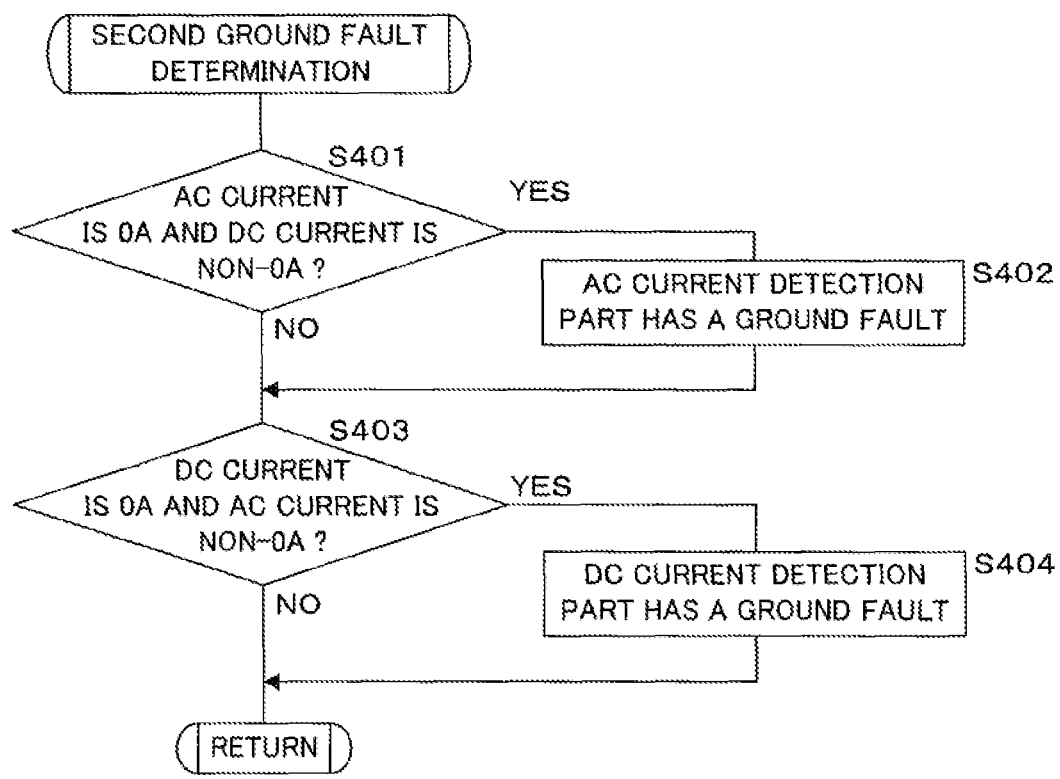

AC-DC BI-DIRECTIONALLY CONVERSION DEVICE WITH FAILURE DETERMINATION FUNCTION, FAILURE DETERMINATION METHOD AND COMPUTER READABLE MEDIUM

This application is the national phase under 35 U.S.C. §371 of PCT International Application No. PCT/JP2013/082436 which has an International filing date of Dec. 3, 2013 and designated the United States of America.

BACKGROUND OF THE INVENTION

1. Field of the Invention

The present invention relates to a conversion device for converting alternating current into direct current, a failure determination method for determining the presence/absence of a failure in various types of detection parts included in the conversion device, and a non-transitory computer readable medium storing a control program for determining the presence/absence of a failure in the detection parts.

2. Description of Related Art

Plug-in Hybrid Electric Vehicle (PHEV) and Electric Vehicle (EV) have become more popular and prevalent, in which a conversion device for converting alternating current supplied from a commercial power supply for household use is mounted to charge a battery with direct current obtained by conversion in the conversion device.

In recent years, it has been expected for a battery of a plug-in hybrid electric vehicle or an electric vehicle to be utilized as a power source for disaster relief or emergency. In order to use a battery as an emergency power source, it is necessary to bi-directionally perform AC-DC conversion.

It is proposed that a conversion device which converts alternating current into direct current and vice versa by performing bidirectional AC-DC conversion. The proposed conversion device includes: a bidirectional AC-DC conversion circuit which functions as a power factor improvement circuit at the time of charging a battery and functions as an inverter circuit at the time of discharging the battery; and an insulated bidirectional DC-DC conversion circuit. The conversion device is provided with various types of detection parts for detecting input/output voltage and current, and performs switching control for the bidirectional AC-DC conversion circuit and bidirectional DC-DC conversion circuit while monitoring the input/output voltage and current, to output desired direct current or alternating current. The conversion device is further provided with a function of detecting excess voltage and excess current for an emergency stop of charging/discharging in order to protect the circuit.

SUMMARY OF THE INVENTION

However, in the case where a failure occurs in the various detection parts in the proposed conversion device, excess voltage and excess current cannot be detected, causing such a problem that normal charge control cannot be performed.

The present invention has been made in view of the circumstances described above, and has an object to provide a conversion device which can determine the presence/absence of a failure in a detection unit for detecting voltage or current of alternating current or direct current (hereinafter also referred to as AC or DC voltage or current).

Another object of the present invention is to provide a failure determination method of determining the presence/absence of a failure in the detection unit included in the conversion device, and a non-transitory computer readable medium storing a control program for determining the presence/absence of a failure in the detection unit.

A conversion device according to the present invention comprising an AC-DC conversion circuit, a DC-DC conversion circuit for converting DC voltage output from the AC-DC conversion circuit, and a detection unit for detecting AC or DC voltage or current is characterized by further comprising: an obtaining part for obtaining information indicating whether or not AC voltage is applied to the AC-DC conversion circuit; and a power supply fault determination part for determining presence/absence of a power supply fault or an open fault in the detection unit if the information obtained by the obtaining part indicates that AC voltage is not applied to the AC-DC conversion circuit.

The conversion device according to the present invention is characterized by comprising: a clock part for measuring time elapsed since the information indicating that AC voltage is applied to the AC-DC conversion circuit is obtained; an elapsed time determination part determining whether or not a predetermined period of time has elapsed since the information indicating the application of AC voltage is obtained; and a first ground fault determination part determining presence/absence of a ground fault in the detection unit for detecting voltage if the elapsed time determination part determines that a predetermined period of time has elapsed since the information indicating the application of AC voltage is obtained.

The conversion device according to the present invention is characterized in that each of the AC-DC conversion circuit and the DC-DC conversion circuit is a conversion circuit of a switching system, and the conversion device further comprises: a switching control part controlling switching of the AC-DC conversion circuit and the DC-DC conversion circuit; and a second ground fault determination part for determining presence/absence of a ground fault in the detection unit for detecting current in a state where switching control is performed for the AC-DC conversion circuit and the DC-DC conversion circuit.

The conversion device according to the present invention is characterized in that the detection unit comprises: an AC voltage detection part for detecting AC voltage applied to the AC-DC conversion circuit; an AC current detection part for detecting AC current applied to the AC-DC conversion circuit; a DC voltage detection part for detecting DC voltage applied to the DC-DC conversion circuit; and a DC current detection part for detecting DC current output from the DC-DC conversion circuit, and the power supply fault determination part compares a detected value of each of the AC voltage detection part, AC current detection part, DC voltage detection part and DC current detection part with a predetermined threshold, to determine presence/absence of a power supply fault or an open fault in each of the detection parts.

The conversion device according to the present invention is characterized in that the detection unit comprises: an AC voltage detection part for detecting AC voltage to be applied to the AC-DC conversion circuit; and a DC voltage detection part for detecting DC voltage to be applied to the DC-DC conversion circuit, and the first ground fault determination part compares voltage detected by each of the AC voltage detection part and DC voltage detection part with a predetermined threshold, to determine presence/absence of a ground fault in each of the detection parts.

The conversion device according to the present invention is characterized by comprising: a switch for turning on/off application of AC voltage to the AC-DC conversion circuit;

a switching control part for switching between on and off of the switch; and a switch failure determination part for determining presence/absence of a failure in the switch, based on the voltage detected by the AC voltage detection part and DC voltage detection part in a state where the switch control part controls the application of AC voltage to be off, and is characterized in that the switch control part controls the application of AC voltage to be on if the switch failure determination part determines that a failure is absent in the switch, and the first ground fault determination part determines presence/absence of a ground fault in the DC voltage detection part in a state where AC voltage is applied to the AC-DC conversion circuit.

The conversion device according to the present invention is characterized in that the detection unit comprises: an AC current detection part for detecting AC current applied to the AC-DC conversion circuit; and a DC current detection part for detecting DC current output from the DC-DC conversion circuit, and the second ground fault determination part comprises: a first determination part for determining that the AC current detection part has a ground fault if the detected AC current is less than a predetermined threshold and the detected DC current is equal to or more than the predetermined threshold; and a second determination part for determining that the DC current detection part has a ground fault if the detected DC current is less than the threshold and the detected AC current is equal to or more than the predetermined threshold.

A failure determination method according to the present invention of determining, in a conversion device including an AC-DC conversion circuit, a DC-DC conversion circuit for converting DC voltage output from the AC-DC conversion circuit, and a detection unit for detecting AC or DC voltage or current, presence/absence of a failure in the detection unit, is characterized by comprising: obtaining information indicating whether or not AC voltage is applied to the AC-DC conversion circuit; and determining presence/absence of a power supply fault or an open fault in the detection unit if the obtained information indicates that AC voltage is not applied to the AC-DC conversion circuit.

A non-transitory computer readable medium storing a control program according to the present invention, in a conversion device including an AC-DC conversion circuit, a DC-DC conversion circuit for converting DC voltage output from the AC-DC conversion circuit, a detection unit for detecting AC or DC voltage or current, and a control circuit for controlling switching of the AC-DC conversion circuit and the DC-DC conversion circuit, causing the control circuit to determine presence/absence of a failure in the detection unit, further causes the control circuit to: determine whether or not information obtained from an outside indicates that AC voltage is not applied to the AC-DC conversion circuit; and determine presence/absence of a power supply fault or an open fault in the detection unit, if the obtained information indicates that AC voltage is not applied to the AC-DC conversion circuit.

According to the present invention, information indicating whether or not AC voltage is applied to the AC-DC conversion circuit is obtained. In the state where power is not supplied from the AC power source, the detected voltage is ground voltage and the detected current is substantially 0 A. If the voltage detected by the detection unit is not the ground voltage, the detection unit is presumed to have a power supply fault or an open fault. Likewise, if the current detected by the detection unit is not substantially 0 A, the detection unit is presumed to have a power supply fault or an open fault. It is therefore possible to determine whether or not the detection unit has a power supply fault or an open fault in the state where AC voltage is not applied to the AC-DC conversion circuit.

It is to be noted that the conversion device according to the present invention includes a device for performing bidirectional conversion between alternating current and direct current. That is, the AC-DC conversion circuit includes a circuit for performing bidirectional conversion between alternating current and direct current, while the DC-DC conversion circuit includes a circuit capable of inverting the direction of input/output of direct current.

According to the present invention, in the case where a predetermined time period has elapsed since information indicating that AC voltage is applied to the AC-DC conversion circuit is obtained, that is, where the power feeding from the AC power source is started and the state of power feeding is stabilized, the voltage detected by the detection unit will be voltage different from the ground voltage. If the voltage detected by the detection unit is ground voltage, the detection unit is presumed to be ground-faulted. It is therefore possible to determine a ground fault in the detection unit for detecting voltage in the state where a predetermined time period has elapsed since the information is obtained indicating that the AC voltage is applied.

According to the present invention, in the case where the switching control for the AC-DC conversion circuit and DC-DC conversion circuit is started, the current detected by the detection part will be a value corresponding to the power feeding state. It is therefore possible to determine whether or not the detection unit for detecting current has a ground fault, in the state where the switching control is performed for the AC-DC conversion circuit and DC-DC conversion circuit.

According to the present invention, it is possible to determine whether or not each of the AC voltage detection part, AC current detection part, DC voltage detection part and DC current detection part has a power supply fault or a ground fault.

According to the present invention, it is possible to determine whether or not each of the AC voltage detection part and DC voltage detection part has a ground fault.

According to the present invention, it is possible to first determine the presence/absence of a failure in a switch, then to control the switch so that AC voltage is applied, and to determine whether or not the DC voltage detection part has a ground fault.

According to the present invention, it is possible to determine whether or not each of the AC current detection part and DC current detection part has a ground fault.

According to the present invention, it is possible to determine the presence/absence of a failure in a detection unit for detecting AC or DC voltage or current, which is included in a conversion device.

BRIEF DESCRIPTION OF THE DRAWINGS

FIG. 8 is a flowchart illustrating a processing procedure of a subroutine concerning the second ground fault determination.

DESCRIPTION OF THE PREFERRED EMBODIMENTS

The present invention will be described below with reference to the drawings illustrating the embodiments thereof.

Figure 1:
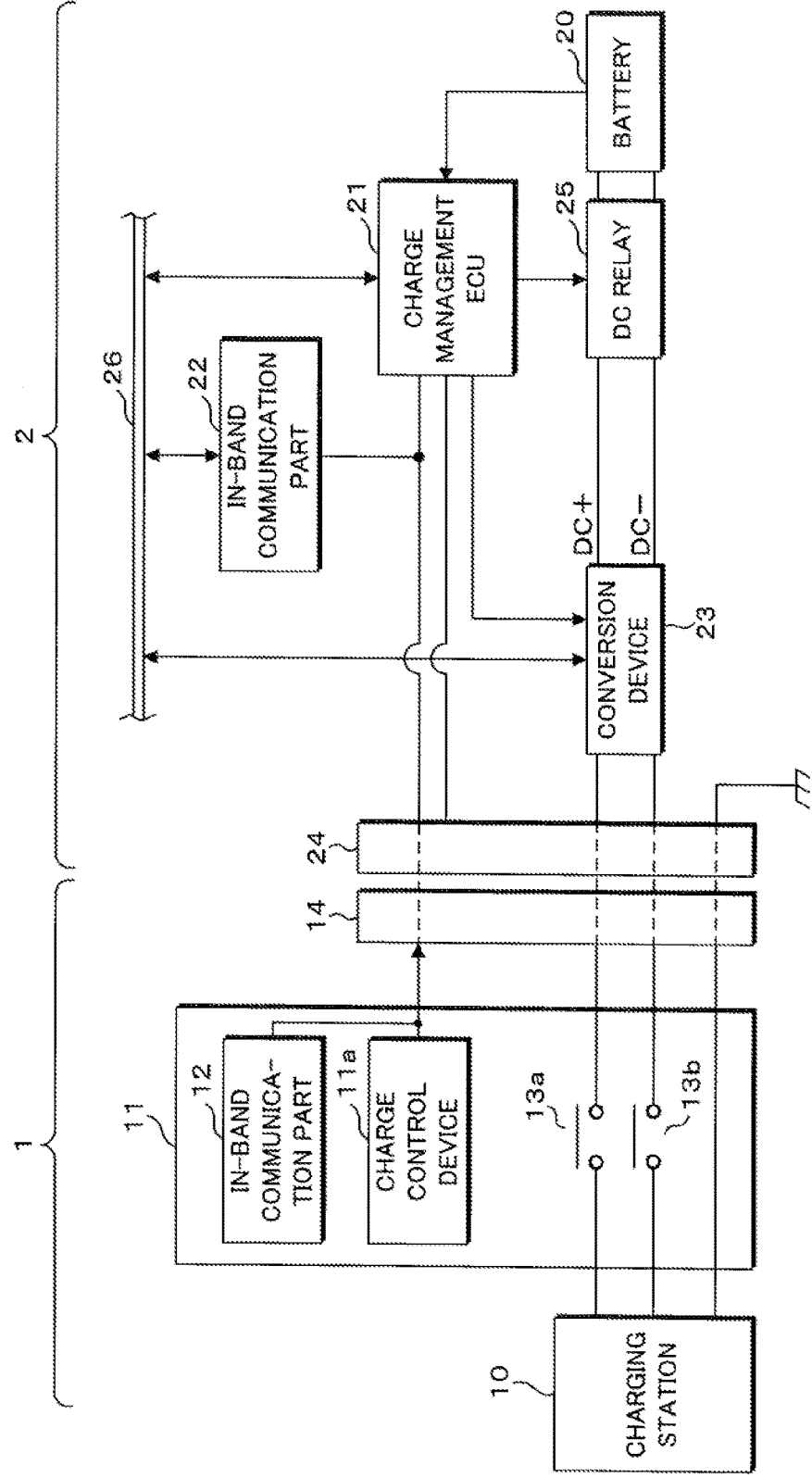
FIG. 1 is a block diagram illustrating a configuration example of a charging system.

FIG. 1 is a block diagram illustrating a configuration example of a charging system. A charging system according to the present embodiment includes an infrastructure-side charging device 1 charging a battery through a power feeding cable, and a vehicle-side charging device 2 installed in a vehicle such as a hybrid automobile, an electric automobile or the like.

The infrastructure-side charging device 1 includes a charging station 11 for supplying alternating current which is supplied from a three-phase AC power source 10 of, for example, 200V, to a vehicle. The charging station 11 is connected to a power feeding cable for feeding alternating current from the AC power source 10, the tip end of the power feeding cable being provided with a charging gun 14. The power feeding cable includes, for example, a feeder line required to feed alternating current, a ground line, a communication line for communicating pilot signals for exchanging information necessary for charge control. The charging gun 14 is inserted into an inlet 24 of a vehicle, and is to electrically connect the charging station 11 with a vehicle. At the part where the charging gun 14 is connected with the inlet 24, a feed terminal, a ground terminal, a signal input/output terminal to/from which a pilot signal is input/output, and the like are located.

Furthermore, the charging station 11 includes a charge control device 11a, an in-band communication part 12 and station-side relays 13a, 13b. The station side relays 13a, 13b are located along the path of the feeder line, and are opened and closed in accordance with the control of the charge control device 11a. The charge control device 11a includes a transmission circuit for transmitting a pilot signal required for charge control, and a detection circuit for detecting the voltage level of a pilot signal. The charge control device 11a outputs a pilot signal of 12V in a phase before the charging gun 14 is connected to a vehicle. This state is called a state A. When the charging gun 14 is connected to the inlet 24 of a vehicle, it is connected to a resistor on the vehicle side, and the voltage of the pilot signal is changed to 9V. This state is called a state B. The charge control device 11a detects the signal level of the pilot signal to sense the connection between the charging gun 14 and inlet 24. Moreover, the charge control device 11a transmits a rectangular pulse signal of 9V when the preparation for charging on the charging station 11 side is completed. This state is called a state B2. When the preparation for charging is completed also on the vehicle side, the resistor on the vehicle side is switched, which changes the voltage of the rectangular pulse signal from 9V to 6V. This state is called a state C. When the voltage of the rectangular pulse signal is changed to 6V, the charge control device 11a closes the station-side relays 13a, 13b within a predetermined period of time, and starts feeding alternating current. The predetermined period of time corresponds to, for example, three seconds.

The in-band communication part 12 is a circuit for transmitting/receiving a control signal which is superposed onto a pilot signal. The in-band communication part 12 transmits/receives information concerning the charging station 11 and the battery 20 mounted on a vehicle, information on the amount of charged current or the like, while the charge control device 11a confirms if it is ready to charge, including availability of charging.

The vehicle-side charging device 2 includes the inlet 24 which is connected to the charging gun 14, and a battery 20 for driving an electric automobile. The inlet 24 has a shape connectable to the charging gun 14, the connecting part thereof being provided with various types of terminals to be connected to the feed terminal of the charging gun 14, ground terminal, signal input/output terminal and the like. The feed terminal is connected to the battery 20 through a conversion device 23 for converting alternating current into direct current and a DC relay 25. The alternating current supplied from the charging station 11 is AC-DC converted by the conversion device 23, and the battery 20 is charged with the direct current obtained by AC-DC conversion.

Furthermore, the vehicle-side charging device 2 includes a charge management ECU 21 and an in-band communication part 22. The charge management ECU 21 is connected to a communication line, and transmits and receives information necessary for charging to/from the charge control device 11a using pilot signals. More specifically, the charge management ECU 21 includes a detection circuit for detecting the voltage level of a pilot signal, as well as a resistor, switch and the like for changing the voltage of a pilot signal.

When the charge management ECU 21 senses that the charging gun 14 is connected to the inlet 24, or that the preparation for charging on the station side is completed, a control signal is output to the conversion device 23 to activate the conversion device 23. The conversion device 23 confirms the presence/absence of a failure in various types of detection parts, as will be described later, and, if an abnormality is found, notifies the charge management ECU 21 of an internal abnormality. If no abnormality is found, the conversion device 23 requests the charge management ECU 21 to start the charge control. When the preparation for charging is completed on the side of the vehicle-side charging device 2, the resistor is switched so as to control the voltage of a rectangular pulse to 6V. Furthermore, the charge management ECU 21 closes the DC relay 25 and feeds power to the battery 20. Moreover, as will be described later, the conversion device 23 determines a failure in various types of detection parts even immediately after the power feeding is started and, if a failure is found, notifies the charge management ECU 21 thereof.

Furthermore, the charge management ECU 21 includes a communication part for transmitting the information indicating the state of the pilot signal to the conversion device 23 through a CAN (Controller Area Network) communication line 26. In other words, information indicating the state of the pilot signal is information indicating whether or not the AC voltage is applied to the AC-DC conversion circuit 4. The state B2 of the pilot signal corresponds to the state where the AC voltage is not applied, while the state C thereof corresponds to the state where the AC voltage is applied. Moreover, the charge management ECU 21 monitors the state of the battery 20, and has a function of determining if the battery 20 is in a normal state and transmitting battery information indicating whether or not the battery 20 is normal to the conversion device 23 through the CAN communication line 26.

The in-band communication part 22 is a circuit for transmitting/receiving a control signal superposed onto the pilot signal. The in-band communication part 22 transmits/receives information concerning the charging station 11 and the battery 20 mounted on a vehicle as well as information such as the amount of charged current, and the charge management ECU 21 confirms preparation for charging, including the availability of charging. Information communication between the in-band communication part 22 and the charge management ECU 21 is performed through, for example, the CAN communication line 26.

Figure 2:
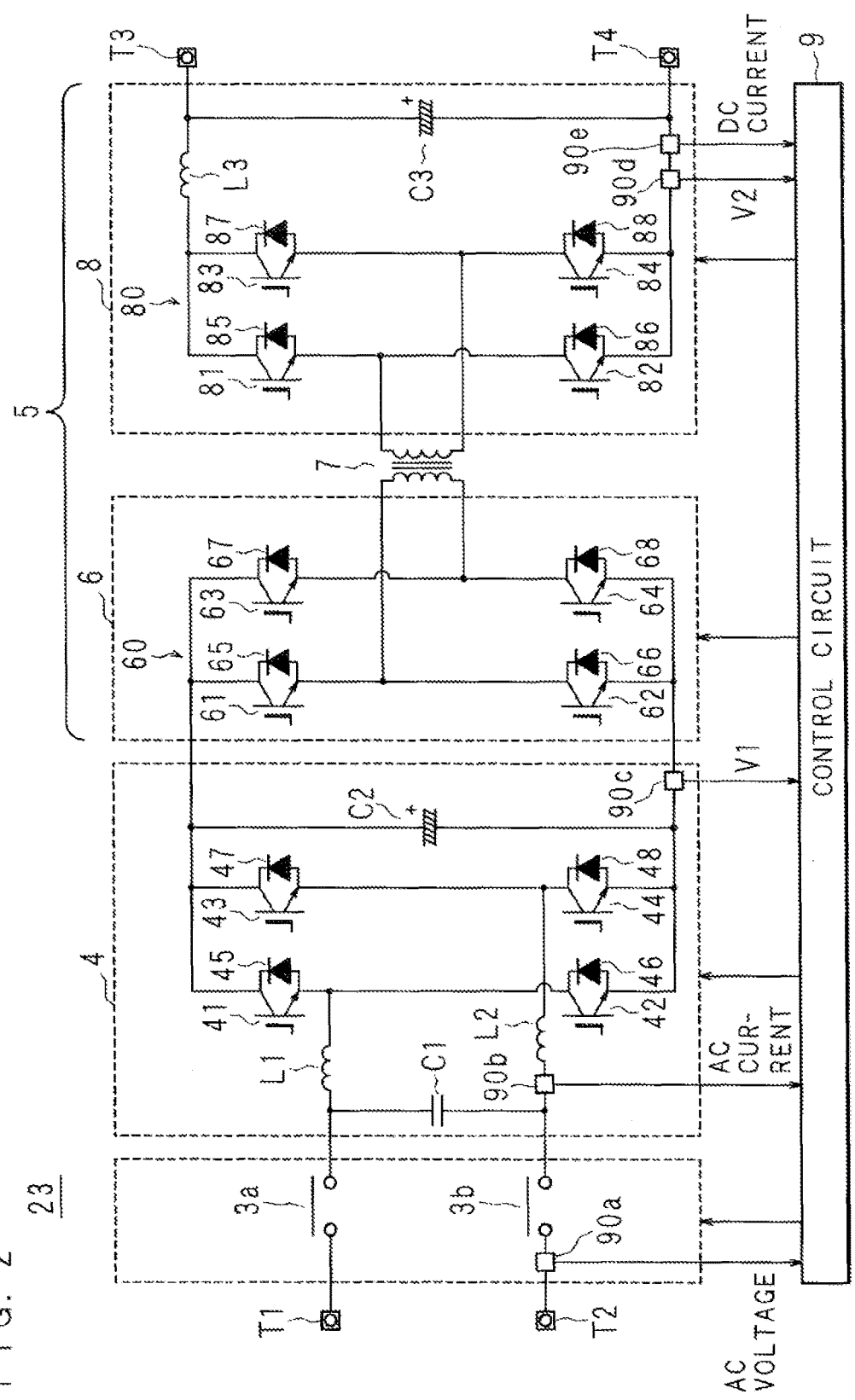
FIG. 2 is a circuit diagram illustrating a configuration example of a conversion device.

FIG. 2 is a circuit diagram illustrating a configuration example of the conversion device 23. The conversion device 23 according to the present embodiment is, for example, an insulated type mounted on a plug-in hybrid vehicle or an electric automobile, and performs bidirectional AC-DC conversion on alternating current and direct current. The conversion device 23 includes an AC input/output terminals T1, T2, DC input/output terminals T3, T4, an AC-DC conversion circuit 4 with a PFC (Power Factor Correction) function, a DC-DC conversion circuit 5, shutoff switches (switches) 3a, 3b for turning on/off the application of AC voltage to the AC-DC conversion circuit 4, and a control circuit 9 performing switching control of each conversion circuit. The DC-DC conversion circuit 5 is configured by, for example, a first bidirectional conversion circuit 6, a voltage converter 7 and a second bidirectional conversion circuit 8.

An AC power source 10 or a load is so connected as to be interchangeable with each other to the AC input/output terminals T1, T2. In the case where the AC power source 10 is connected to the AC input/output terminals T1, T2, and the AC voltage is applied, the alternating current is converted into direct current through AC-DC conversion, and the voltage of the converted direct current is output from the direct current input/output terminals T3, T4. The battery 20 is connected to the DC input/output terminals T3, T4 through the DC relay 25, and the battery 20 is charged with the direct current output from the DC input/output terminals T3, T4. In the case where the load is connected to the AC input/output terminals T1, T2, the DC voltage applied to the DC input/output terminals T3, T4 by the battery 20 is converted into alternating current through AC-DC conversion, and the alternating current obtained by conversion is supplied to the load via the AC input/output terminals T1, T2. As such, the conversion device 23 performing bidirectional AC-DC conversion for alternating current and direct current is mounted on a vehicle, so that the battery 20 can be utilized as a power source for disaster-relief or emergency.

The shutoff switches 3a, 3b are located between the AC input/output terminals T1, T2 and the AC-DC conversion circuit 4. The shutoff switches 3a, 3b are relays for example, and are controlled by the control circuit 9 to be switched between on and off.

The AC-DC conversion circuit 4 with PFC function is a circuit for performing bidirectional AC-DC conversion for alternating current and direct current through the switching control by a full bridge circuit. The AC-DC conversion circuit 4 with PFC function includes capacitors C1, C2, coils L1, L2 and first to fourth switching elements 41, 42, 43 and 44 as well as diodes 45, 46, 47 and 48, which constitute a full-bridge circuit. The first to fourth switching elements 41, 42, 43 and 44 are power devices such as IGBT (Insulated Gate Bipolar Transistor) or MOSFET (Metal-Oxide-Semiconductor Field Effect Transistor). Hereinafter, the present embodiment will be described by regarding the first to fourth switching elements 41, 42, 43 and 44 as IGBTs. One end of each of the shutoff switches 3a and 3b is connected to a corresponding one of the AC input/output terminals T1 and T2, whereas the respective ends of the capacitor C1 are connected to the other ends of the shutoff switches 3a and 3b. One end of the coil L1 is connected to the other end of the shutoff switch 3a, while the other end of the coil L1 is connected to the emitter of the first switching element 41 and to the collector of the second switching element 42. One end of the coil L2 is connected to the other end of the shutoff switch 3b, while the other end of the coil L2 is connected to the emitter of the third switching element 43 and the collector of the fourth switching element 44.

The collectors of the first and third switching elements 41 and 43 are connected to the first bidirectional conversion circuit 6. The emitters of the first and third switching elements 41, 43 are connected to the collectors of the second and fourth switching elements 42 and 44, respectively, while the emitters of the second and fourth switching elements 42, 44 are connected to the first bidirectional conversion circuit 6. The cathodes of the first to fourth diodes 45, 46, 47 and 48 are connected to the collectors of the first to fourth switching elements 41, 42, 43 and 44, while the anodes of the first to fourth diodes 45, 46, 47 and 48 are connected to the emitters of the first to fourth switching elements 41, 42, 43 and 44. Furthermore, the collectors of the first and third switching elements 41 and 43 are connected to one end of the capacitor C2, while the other end of the capacitor C2 is connected to the emitters of the second and fourth switching elements 42, 44.

The first bidirectional conversion circuit 6 is a circuit for performing bidirectional AC-DC conversion for alternating current and direct current through the switching control by the full bridge circuit 60. The first bidirectional conversion circuit 6 includes the first to fourth switching elements 61, 62, 63 and 64 as well as diodes 65, 66, 67 and 68 constituting the full bridge circuit 60. The collectors of the first and third switching elements 61 and 63 are connected to the collectors of the first and third switching elements 41 and 43. The emitters of the first and third switching elements 61 and 63 are connected to the collectors of the second and fourth switching elements 62 and 64, respectively, while the emitters of the second and fourth switching elements 62 and 64 are connected to the emitters of the second and fourth switching elements 42 and 44. The cathodes of the diodes 65, 66, 67 and 68 are connected to the collectors of the first to fourth switching elements 61, 63, 62 and 64, while the anodes of the diodes 65, 66, 67 and 68 are connected to the emitters of the first to fourth switching elements 61, 63, 62 and 64.

The voltage converter 7 includes multiple magnetically-coupled coils, e.g., the first coil and the second coil. The pair of terminals of the first coil are connected to the emitters of the first switching element 61 and the third switching element 63, respectively. When the AC voltage output from the first bidirectional conversion circuit 6 is applied to the first coil, alternating magnetic flux is generated at the first coil, and converted AC voltage is generated at the second coil due to the alternating magnetic flux.

The second bidirectional conversion circuit 8 is a circuit performing bidirectional AC-DC conversion for alternating current and direct current through switching control by the full bridge circuit 80. The second bidirectional conversion circuit 8 includes a capacitor C3, a coil L3, and the first to fourth switching elements 81, 82, 83 and 84 as well as diodes 85, 86, 87 and 88 constituting the full bridge circuit 80. One end of the second coil constituting the voltage converter 7 is connected to the emitter of the first switching element 81 and the collector of the second switching element 82, while the other end of the second coil is connected to the emitter of the third switching element 83 and the collector of the fourth switching element 84.

The collectors of the first and third switching elements 81 and 83 are connected to one end of the coil L3, while the other end of the coil L3 is connected to the DC input/output terminal T3. The emitters of the first and third switching elements 81 and 83 are connected to the collectors of the second and fourth switching elements 82 and 84, respectively, while the emitters of the second and fourth switching elements 82 and 84 are connected to the DC input/output terminal T4. The cathodes of the diodes 85, 86, 87 and 88 are connected to the collectors of the first to fourth switching elements 81, 82, 83 and 84, while the anodes of the diodes 85, 86, 87 and 88 are connected to the emitters of the switching elements 81, 82, 83 and 84, respectively. Moreover, one end of the capacitor C3 is connected to the DC input/output terminal T3, while the other end of the capacitor C3 is connected to the DC input/output terminal T4.

The capacitor C3 is an element for smoothing the DC voltage output from the full bridge circuit 80. The coil L3 is an element for suppressing ripple current, caused by switching of the first to fourth switching elements 81, 82, 83 and 84, flowing into the capacitor C3, and preventing the capacitor C3 from being damaged.

In addition, the conversion device 23 includes a detection unit for detecting voltage and current of alternating current or direct current. For example, the conversion device 23 includes an AC voltage detection part 90a for detecting the AC voltage applied to the AC-DC conversion circuit 4, an AC current detection part 90b for detecting AC current applied to the AC-DC conversion circuit 4, a first DC voltage detection part 90c for detecting DC voltage applied to the DC-DC conversion circuit 5, a second DC voltage detection part 90d for detecting DC voltage output from the DC-DC conversion circuit 5, and a DC current detection part 90e for detecting DC current output from the DC-DC conversion circuit 5.

The AC voltage detection part 90a is located on a lead wire which connects the AC input/output terminal T2 and one end of the shutoff switch 3b, to output a signal having a level corresponding to the voltage of the lead wire, i.e. the AC voltage applied to the AC-DC conversion circuit 4, to the control circuit 9. For example, the AC voltage detection part 90a is a circuit which includes a rectifier circuit connected to the lead wire and a divided voltage resistance for dividing the DC voltage rectified by the rectification circuit, to output the divided voltage to the control circuit 9. It is to be noted that the divided voltage may be amplified by the amplifier before being output to the control circuit 9, or AD (analog to digital) conversion may be performed on the voltage and the converted voltage value may be output to the control circuit 9.

The first DC voltage detection part 90c is a circuit which is connected to the output terminal of the AC-DC conversion circuit 4 or the input terminal of the DC-DC conversion circuit 5, and outputs a signal having a level corresponding to the DC voltage to be input to the DC-DC conversion circuit 5 to the control circuit 9. The first DC voltage detection part 90c is a circuit which includes a divided voltage resistance connected to the output terminal of the AC-DC conversion circuit 4 or the input terminal of the DC-DC conversion circuit 5, and outputs the voltage divided by the divided voltage resistance to the control circuit 9. The divided voltage may be amplified by an amplifier before being output to the control circuit 9, or AD conversion may be performed on the voltage and the converted voltage value may be output to the control circuit 9.

The second DC voltage detection part 90d has a configuration similar to that of the first DC voltage detection part 90c, which is connected to, for example, the DC input/output terminal T4 and outputs a signal having a level corresponding to the voltage output from the DC input/output terminal T4 to the control circuit 9.

The AC current detection part 90b is located on a lead wire for connecting the other end of the shutoff switch 3b and the coil L2, and outputs a signal having a level corresponding to the current input to the AC-DC conversion circuit 4 to the control circuit 9. The AC current detection part 90b is a circuit which includes, for example, a current transformer, and converts the current converted by the current transformer into voltage and outputs the obtained voltage to the control circuit 9.

The DC current detection part 90e is connected to the DC input/output terminal T4, and outputs a signal corresponding to the current output from the DC input/output terminal T4 to the control circuit 9. The DC current detection part 90e is, for example, a hall element sensor. The hall element sensor detects, in a hall element, a magnetic field generated by the current flowing in the lead wire, amplifies the hall voltage generated in the hall element due to the magnetic field, and outputs the amplified value as a current value.

Figure 3:
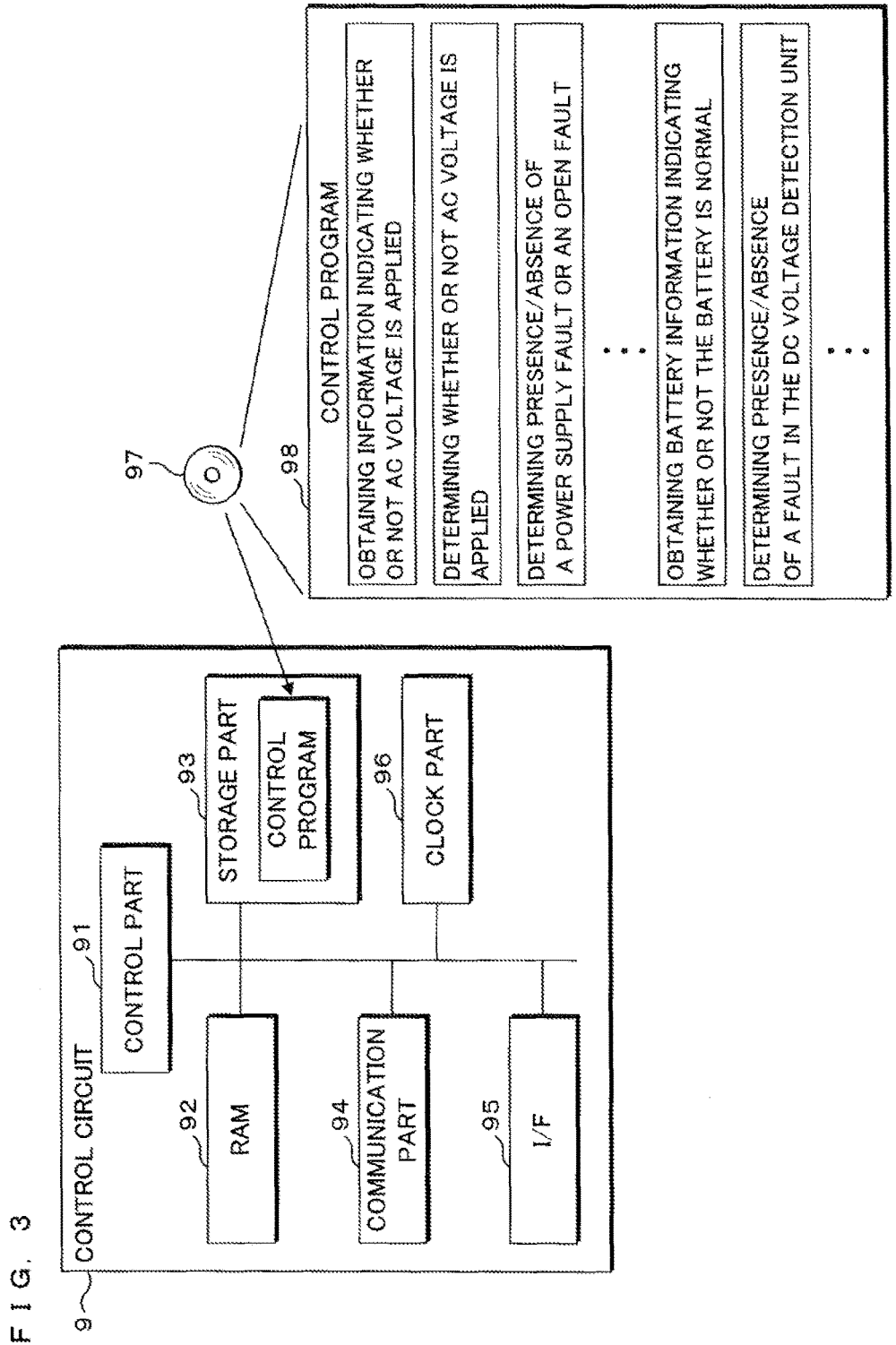
FIG. 3 is a block diagram illustrating a configuration example of a control circuit.

FIG. 3 is a block diagram illustrating a configuration example of the control circuit 9. The control circuit 9 includes a control part 91 such as a CPU (Central Processing Unit) for controlling the operation of each component of the control circuit 9. The control part 91 is connected via a bus to a RAM 92, a storage part 93, a communication part 94, an interface 95, and a clock part 96 for measuring timing for determining a failure in the various detection parts, timing for switching control and the like.

The storage part 93 is a non-volatile memory such as EEPROM (Electrically Erasable Programmable ROM), which stores therein a control program 98 for switching control according to the present embodiment.

Furthermore, the control program 98 is recorded in a storage medium 97 such as a computer-readable portable recording medium including a CD (Compact Disc)-ROM, a DVD (Digital Versatile Disc)-ROM and a BD (Blu-ray (registered trademark) Disc), or a hard disk drive, a solid state drive or the like. The control part 91 may read out the control program 98 from the recording medium 97 to be stored in the storage part 93.

Furthermore, the control program 98 according to the present invention may be obtained from an external computer (not illustrated) connected to a communication network, and may be stored in the storage part 93.

The RAM 92 is a memory such as a DRAM (Dynamic RAM), an SRAM (Static RAM) or the like, which temporarily stores the control program 98 read out from the storage part 93 when arithmetic processing is executed by the control part 91, and various kinds of data generated in the arithmetic processing executed by the control part 91.

The communication part 94 includes a CAN communication circuit which transmits and receives various kinds of information to/from the charge management ECU 21 in accordance with a CAN communication protocol. Furthermore, the communication part 94 receives a charge instruction for instructing to convert alternating current into direct current, a discharge instruction for instructing to convert direct current into alternating current, a terminating instruction and the like.

Connected to the interface 95 are the AC-DC conversion circuit 4 with PFC function as well as the gates of the first to fourth switching elements 41, . . . , 44, 61, . . . , 64, 81, . . . , 84, that constitute the first and second bidirectional conversion circuits 6 and 8. By applying voltage to the gates, switching control is performed for each circuit.

Furthermore, the AC voltage detection part 90*a*, AC current detection part 90*b*, first DC voltage detection part 90*c*, second DC voltage detection part 90*d* and DC current detection part 90*e* are connected to the interface 95, to which signals output from each of the detection parts are input.

When receiving the charge instruction at the communication part 94, the control part 91 performs switching control so that the AC-DC conversion circuit 4 with PFC function operates as a power factor improvement circuit and an AC-DC conversion circuit, that the first bidirectional conversion circuit 6 operates as a DC-AC conversion circuit, and that the second bidirectional conversion circuit 8 operates as an AC-DC conversion circuit. Furthermore, when receiving the discharge instruction at the communication part 94, the control part 91 performs switching control so that the second bidirectional conversion circuit 8 operates as a DC-AC conversion circuit, that the first bidirectional conversion circuit 6 operates as an AC-DC conversion circuit 4, and that the AC-DC conversion circuit 4 with PFC function operates as a DC-AC conversion circuit.

Next, the procedure of determining the presence/absence of a failure in each detection part included in the conversion device 23 will be described below.

Figure 4:
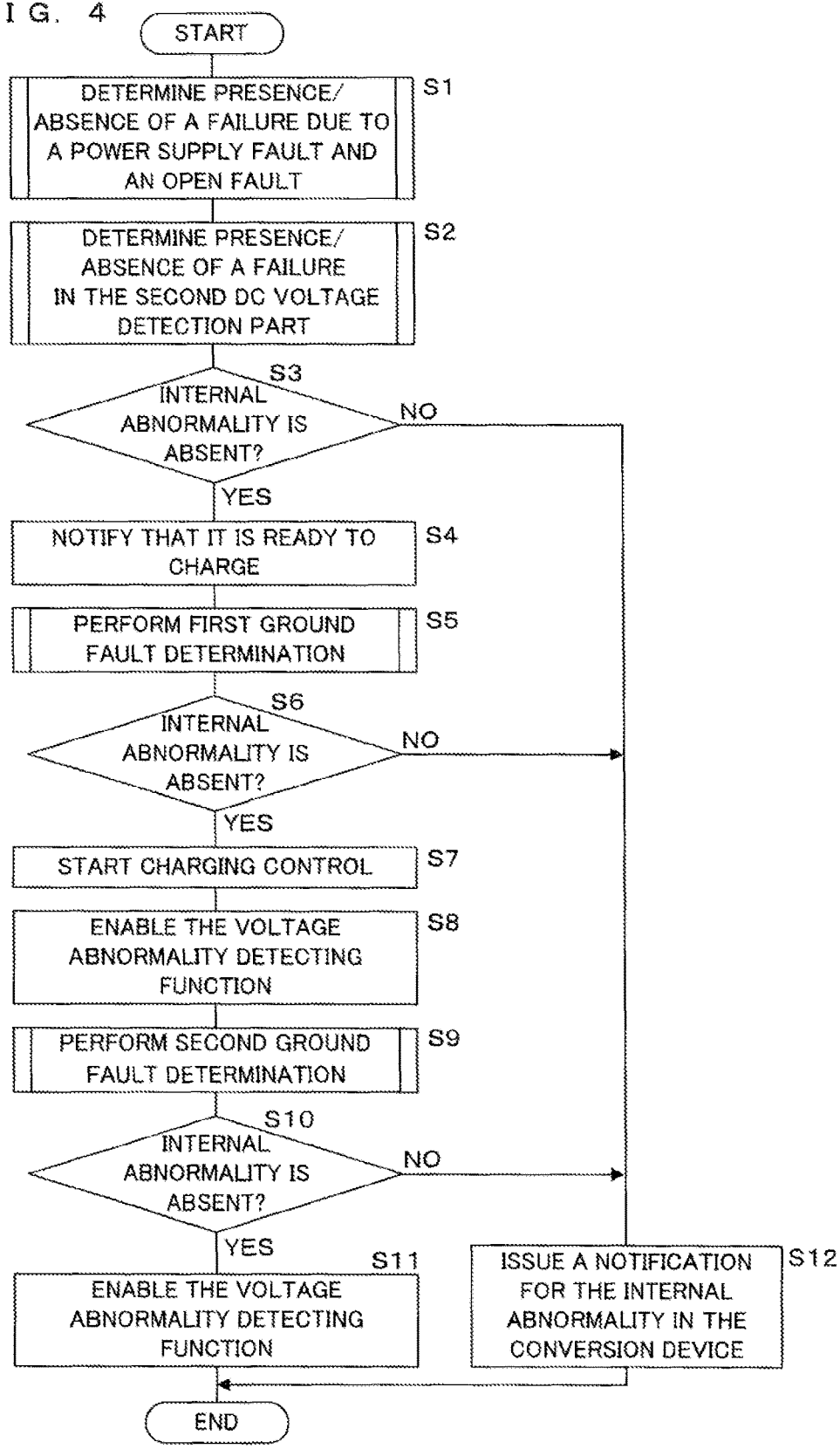
FIG. 4 is a flowchart illustrating a processing procedure of a control part.

FIG. 4 is a flowchart illustrating a processing procedure of a control part 91. First, the control part 91 determines the presence/absence of a failure due to a power supply fault and an open fault in each detection part (step S1). The power supply fault means the state of being short-circuited to the power supply potential.

Figure 5:
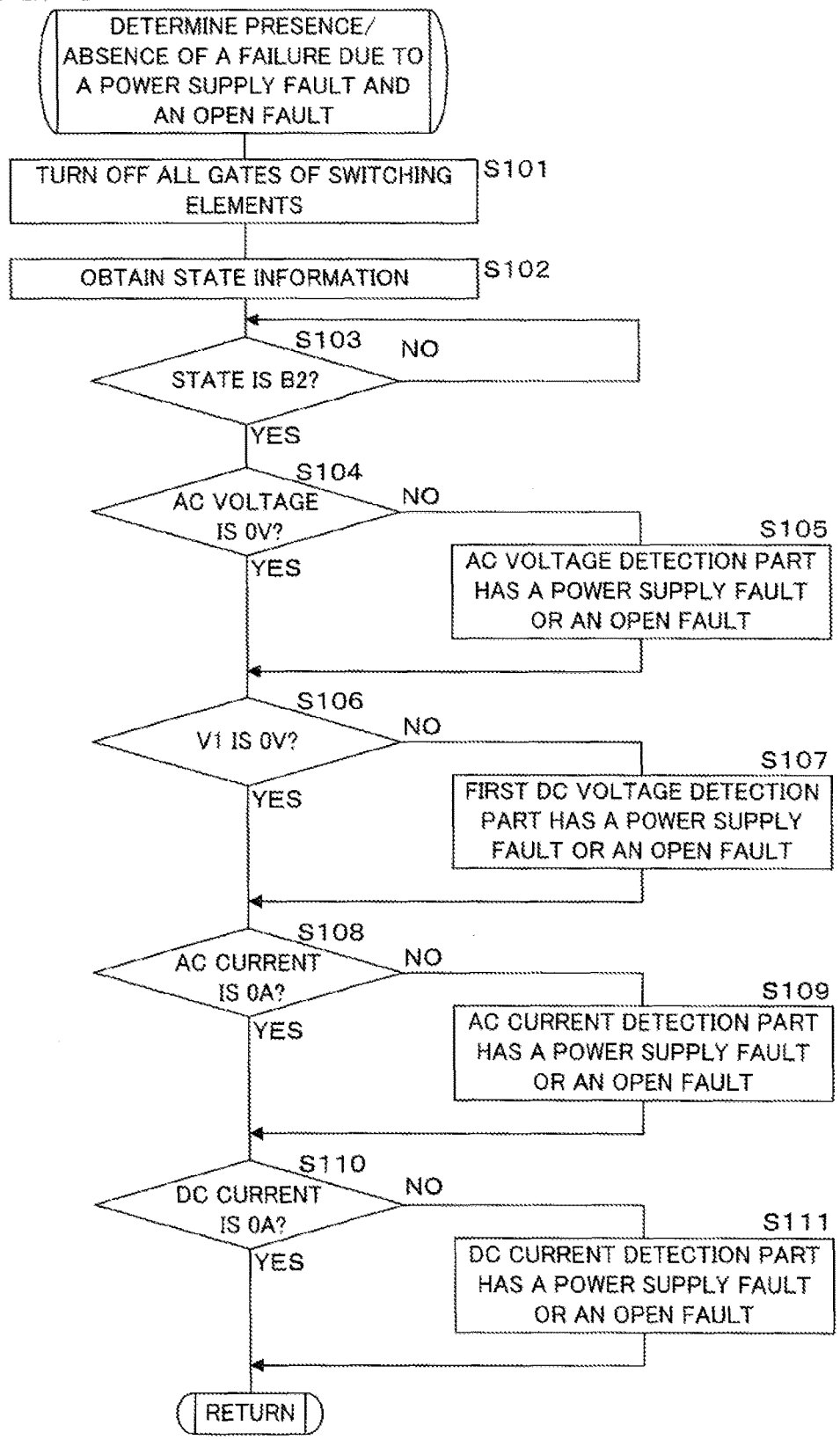
FIG. 5 is a flowchart illustrating a processing procedure of a subroutine concerning determination on a power supply fault or an open fault.

FIG. 5 is a flowchart illustrating a processing procedure of a subroutine concerning determination on a power supply fault or an open fault. The control part 91 turns off all the gates of the switching elements 41, 42, . . . , 83 and 84 constituting the AC-DC conversion circuit 4 and DC-DC conversion circuit 5 (step S101). Subsequently, the control part 91 obtains state information through the communication part 94 (step S102), and determines whether or not it is in the state B2 (step S103). Note that the state information may not necessarily be obtained through the CAN communication line 26 but may also be obtained via a dedicated line which connects the charge management ECU 21 to the conversion device 23. It is also possible to directly receive pilot signals transmitted from the charge control device 11*a* and to determine whether or not it is in the state B2. Moreover, not limited to state information, information in any manner may be possible as long as the information indicates whether or not the AC voltage is applied to the AC-DC conversion circuit 4. If it is determined that it is not in the state B2 (step S103: NO), the control part 91 repeatedly executes the processing of step S103. If it is determined that it is in the state B2 (step S103: YES), the control part 91 determines whether or not the AC voltage detected by the AC voltage detection part 90*a* is 0V (step S104). More specifically, the control part 91 determines whether or not the AC voltage is less than a predetermined threshold. If it is determined that the AC voltage is not 0V (step S104: NO), the control part 91 stores that the AC voltage detection part 90*a* has a power supply fault or an open fault (step S105).

If it is determined that the AC voltage is 0V (step S104: YES), or the processing at step S105 is completed, the control part 91 determines whether or not the voltage V1 detected by the first DC voltage detection part 90*c* is 0V (step S106). More specifically, the control part 91 determines whether or not the voltage V1 is less than a predetermined threshold. If it is determined that the voltage V1 is not 0V (step S106: NO), the control part 91 stores the fact that the first DC voltage detection part 90*c* has a power supply fault or an open fault (step S107).

If it is determined that the voltage V1 is 0V (step S106: YES), or if the processing at step S107 is completed, it is determined whether or not the AC current detected by the AC current detection part 90*b* is 0 A (step S108). If it is determined that the AC current is not 0 A (step S108: NO), the control part 91 stores that the AC current detection part 90*b* has a power supply fault or an open fault (step S109).

If it is determined that the AC current is 0 A (step S108: YES) or the processing at step S109 is completed, the control part 91 determines whether or not the DC current detected by the DC current detection part 90*e* is 0 A (step S110).

If it is determined that the DC current is 0 A (step S110: YES), the control part 91 terminates the processing of the subroutine. If it is determined that the DC current is not 0 A (step S110: NO), the control part 91 stores that the DC current detection part 90*e* has a power supply fault or an open fault (step S111), and terminates the processing of the subroutine.

It is to be noted that the order of detecting a power supply fault or an open fault in each detection part as illustrated in FIG. 5 is a mere example, and the order of processing is not specifically limited thereto.

After terminating the processing at step S1 concerning determination on a power supply fault and an open fault as illustrated in FIG. 4, the control part 91 determines the presence/absence of a failure in the second DC voltage detection part 90*d* (step S2).

Figure 6:
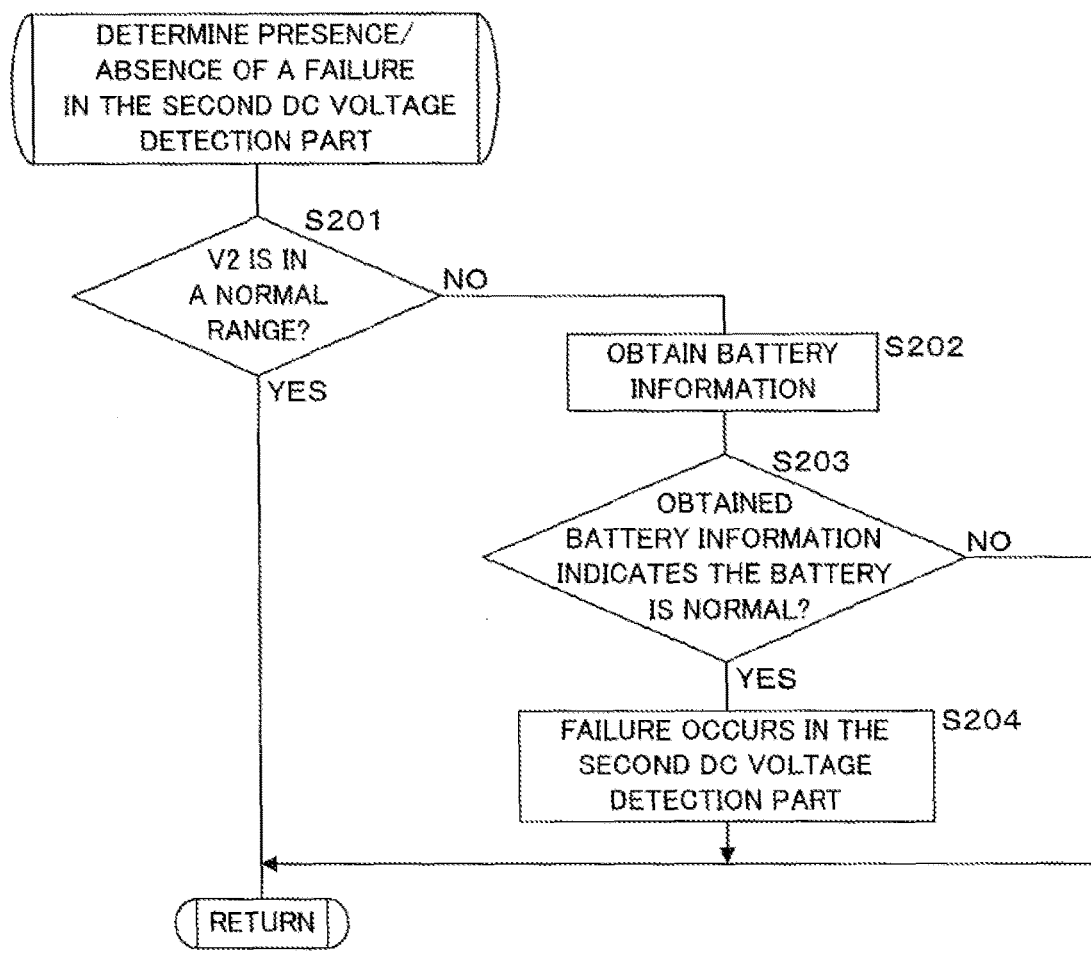
FIG. 6 is a flowchart illustrating a processing procedure of a subroutine concerning determination on a failure in the second DC voltage detection part.

FIG. 6 is a flowchart illustrating a processing procedure of a subroutine concerning determination on a failure in the second DC voltage detection part 90*d*. The control part 91 determines whether or not the voltage V2 detected by the second DC voltage detection part 90*d* is in a normal range (step S201). More specifically, the control part 91 reads out, from the storage part 93, information indicating a predetermined voltage range corresponding to the normal range. The control part 91 then determines whether the voltage V2 is or is not in the predetermined voltage range.

The predetermined voltage range may be stored in the storage part 93 of the control circuit 9 in advance, or may be obtained from the charge management ECU 21 and stored in the storage part 93. The charge management ECU 21 specifies a predetermined voltage range in accordance with the state of the battery 20, and transmits the specified predetermined voltage range to the conversion device 23. Here, the control part 91 in the conversion device 23 can more accurately determine whether or not the voltage V2 corresponds to a normal voltage value.

If it is determined that the voltage V2 is in the normal range (step S201: YES), the control part 91 terminates the processing of the subroutine. If it is determined that the voltage V2 is not in the normal range (step S201: NO), the control part 91 obtains battery information from the charge management ECU 21 through the communication part 94 (step S202). The battery information includes information indicating whether or not the battery 20 is normal.

Subsequently, the control part 91 determines whether or not the battery 20 is normal based on the battery information (step S203), and if it is determined that the battery 20 is normal (step S203: YES), the control part 91 stores that a failure occurs in the second DC voltage detection part 90*d* (step S204), and terminates the processing of the subroutine. If it is determined that the battery 20 is not normal (step S203: NO), the control part 91 terminates the processing of the subroutine.

After terminating the processing concerning the determination on a failure in the second DC voltage detection part 90*d* as illustrated in FIG. 4, the control part 91 determines the presence/absence of an internal abnormality in the conversion device 23 based on the determination results of step S1 and step S2 (step S3). If it is determined that an internal abnormality is absent (step S3: YES), the control part 91 notifies the charge management ECU 21 through the communication part 94 that it is ready to charge (step S4). Subsequently, the control part 91 performs the first ground fault determination (step S5). The first ground fault determination is processing for determining the presence/absence of a ground fault in the AC voltage detection part 90*a* and the first DC voltage detection part 90*c*. The ground fault means the state of being short-circuited to the ground potential.

Figure 7:
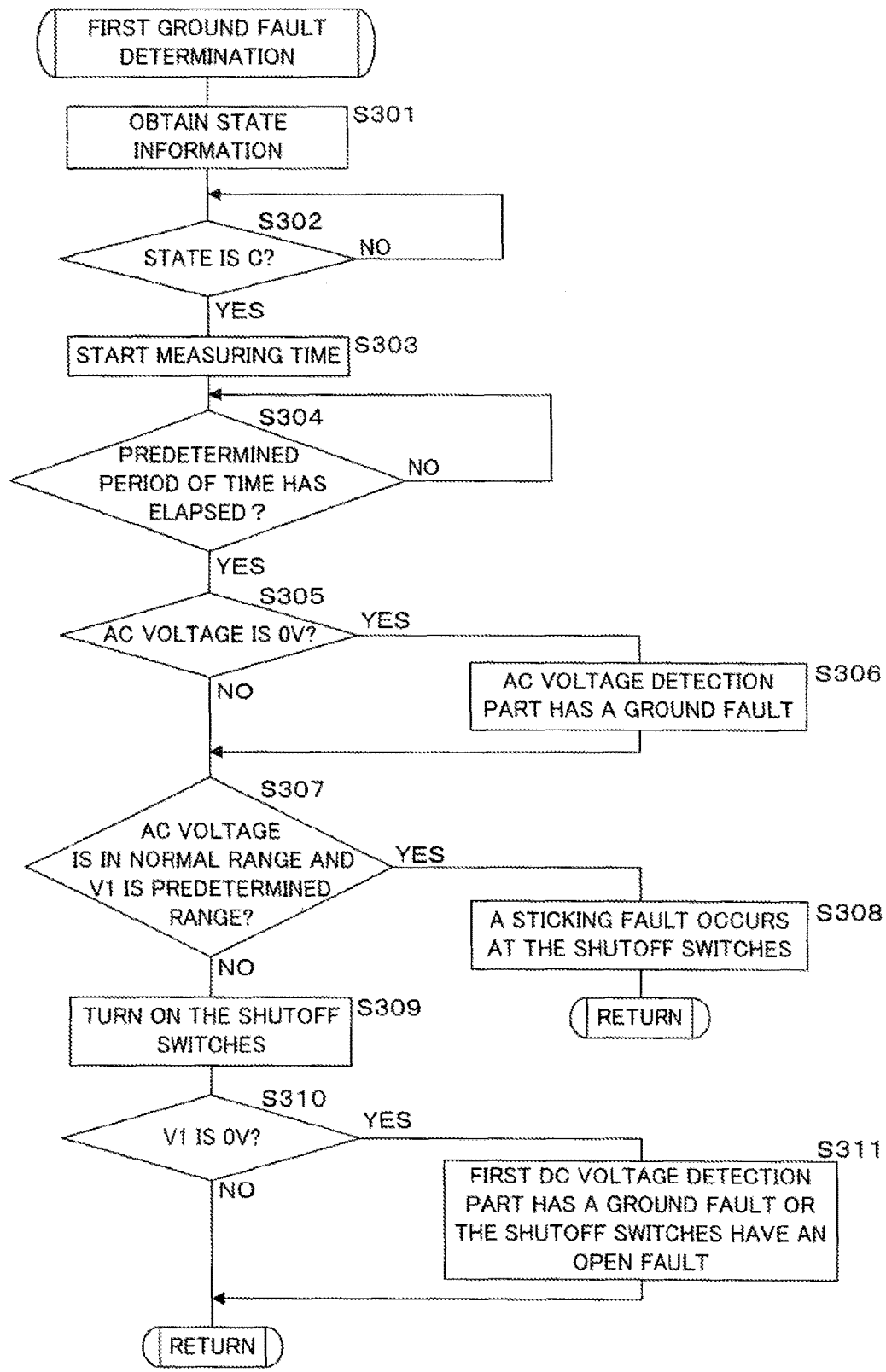
FIG. 7 is a flowchart illustrating a processing procedure of a subroutine concerning the first ground fault determination.

FIG. 7 is a flowchart illustrating a processing procedure of a subroutine concerning the first ground fault determination. The control part 91 obtains the state information through the communicating part 94 (step S301), and determines whether or not it is in the state C (step S302). It is also possible to determine whether or not it is in the state D, which is similar to the state C. The state D corresponds to a pilot signal used in the case where ventilation is required in charging. If it is determined that it is not in the state C (step S302: NO), the control part 91 repeatedly executes the processing of step S302. If it is determined that it is in the state C (step S302: YES), the control part 91 starts measuring time by the clock part 96 (step S303). The control part 91 then determines whether or not a predetermined period of time has elapsed since the AC voltage is applied to the AC-DC conversion circuit 4 (step S304). If it is determined that the predetermined period of time has not elapsed (step S304: NO), the control part 91 repeatedly executes the processing at S304. If it is determined that the predetermined period of time has elapsed (step S304: YES), the control part 91 determines whether or not the AC voltage detected by the AC voltage detection part 90*a* is 0V (step S305). More specifically, the control part 91 determines whether or not the AC voltage is less than a predetermined threshold. While an example has been described where the processing steps from S305 on are executed after a predetermined period of time has elapsed since the start of the state C in the present embodiment, the processing of step S305 may also be executed without waiting for the predetermined period of time to pass if the AC voltage can be confirmed as normal. If it is determined that the AC voltage is 0V (step S305: YES), the control part 91 stores that the AC voltage detection part 90*a* has a ground fault (step S306).

If it is determined that the AC voltage is not 0V (step S305: NO), or the processing at step S306 is terminated, the control part 91 opens the shutoff switches 3*a* and 3*b*, and determines whether or not the AC voltage, which is detected in the state where the application of the AC voltage is controlled to be off, is in a normal range, and the voltage V1 detected by the first DC voltage detection part 90*c* is in a predetermined range (step S307). More specifically, the control circuit 9 stores the first voltage range corresponding to the normal range of the AC voltage and the second voltage range corresponding to the predetermined range in the storage part 93 in advance. The first voltage range is a range for a value which may be obtained as an effective value of the AC voltage of 200V supplied from the AC power source 10. The second voltage range is a range for a value which may be obtained as DC voltage output from the stopped DC-DC conversion circuit 4 in the case where the alternating current of 200V is applied to the DC-DC conversion circuit 4. If it is determined that the AC voltage is in a normal range and the voltage V1 detected by the first DC voltage detection part 90*c* is in a predetermined range (step S307: YES), the control part 91 stores that a sticking fault occurs at the shutoff switches 3*a* and 3*b* (step S308), and terminates the processing of the subroutine. If it is determined that the AC voltage is in a normal range and the voltage V1 detected by the first DC voltage detection part 90*c* is outside a predetermined range (step S307: NO), the control part 91 turns on the shutoff switches 3*a* and 3*b* (step S309). That is, the control part 91 determines that no sticking fault occurs at the shutoff switches 3*a* and 3*b*, and controls switching of the shutoff switches 3*a*, 3*b* so that the AC voltage is applied.

Note that the control part 91 preferably stops the charging process if the AC voltage is not in the normal range. This is because the current is increased in order to obtain a desired output if, for example, the AC voltage is a low voltage.

Subsequently, the control part 91 determines whether or not the voltage V1 detected by the first DC voltage detection part 90*c* is 0V (step S310). More specifically, the control part 91 determines whether or not the voltage V1 is less than a predetermined threshold. If it is determined that the voltage V1 is not 0V (step S310: NO), the control part 91 terminates the processing of the subroutine. If it is determined that the voltage V1 is 0V (step S310: YES), the control part 91 stores that the first DC voltage detection part 90*c* has a ground fault or the shutoff switches 3*a*, 3*b* have an open fault (step S311), and terminates the processing of the subroutine.

It is to be noted that the order of detecting a ground fault in each of the detection parts illustrated in FIG. 7 is a mere example, and the order is not specifically limited thereto.

The control part 91 which terminated the processing of step S5 as illustrated in FIG. 4 determines the presence/absence of an internal abnormality in the conversion device 23 based on the determination result of step S5 (step S6). If it is determined that an internal abnormality is absent in the conversion device 23 (step S6: YES), the control part 91 starts the charging control (step S7). More specifically, the control part 91 performs switching control for turning on/off the gate of each of the switching elements 41, 42, . . . , 83, 84 constituting the AC-DC conversion circuit 4 and DC-DC conversion circuit 5, and performs control to convert alternating current into desired direct current. The control part 91 then enables the voltage abnormality detecting function (step S8). That is, the control part 91 determines whether or not each voltage detected by the AC voltage detection part 90*a*, the first DC voltage detection part 90*c* and the second DC voltage detection part 90*d* is equal to or less than a predetermined upper limit voltage value stored in the storage part 93, to monitor if no excess voltage occurs. If excess voltage is detected, the control part 91 shuts off the application of the AC voltage by opening the shutoff switches 3*a*, 3*b*, and makes the gates of the switching elements 41, 42, . . . , 83, 84 be in the off state.

Subsequently, the control part 91 performs the second ground fault determination in the state where the switching control is being performed for the AC-DC conversion circuit 4 and DC-DC conversion circuit 5 (step S9). The second ground fault determination is processing for determining the presence/absence of a ground fault in the AC current detection part 90b and DC current detection part 90e.

FIG. 8 is a flowchart illustrating a processing procedure of a subroutine concerning the second ground fault determination. The control part 91 determines whether or not the AC current detected by the AC current detection part 90b is 0 A and the DC current detected by the DC current detection part 90e is non-0 A (step S401). More specifically, the control part 91 determines whether or not the AC current is less than a threshold and the DC current is equal to or more than the threshold. If the AC current is 0 A and the DC current is non-0 A (step S401: YES), the control part 91 stores that the AC current detection part 90e has a ground fault (step S402).

If determined that it is not in a state where the AC current is 0 A and the DC current is non-0 A (step S401: NO), the control part 91 determines whether or not the DC current is 0 A and the AC current is non-0 A (step S403). If determined that it is not in a state where the DC current is 0 A and the AC current is non-0 A (step S403: NO), the control part 91 terminates the processing of the subroutine. If it is determined that the DC current is 0 A and the AC current is non-0 A (step S403: YES), the control part 91 stores that the DC current detection part 90e has a ground fault (step S404), and terminates the subroutine.

It is to be noted that the order of detecting a ground fault in each detection part illustrated in FIG. 8 is a mere example, and the order is not specifically limited thereto.

The control part 91 which terminated the second ground fault determination then determines the presence/absence of an internal abnormality in the conversion device 23 based on the determination result of step S9 (step S10). If it is determined that an internal abnormality is absent (step S10: YES), the control part 91 enables a current abnormality detecting function (step S11), and terminates the processing according to the present embodiment. That is, the control part 91 determines whether or not each current detected by the AC current detection part 90b and DC current detection part 90e is equal to or less than predetermined upper limit current which is stored in the storage part 93, to monitor whether or not excess current occurs. If excess current is detected, the control part 91 opens the shutoff switches 3a, 3b to shut off the application of the AC voltage, and makes the gate of each of the switching elements 41, 42, . . . , 83, 84 be in the off state. If it is determined that an internal abnormality is present at steps S3, S6 and S10 (steps 3, 6, 10: NO), the control part 91 issues a notification for the internal abnormality in the conversion device 23 (step S12), and terminates the processing. For example, the control part 91 transmits the fact that an abnormality is found in the conversion device 23, information for identifying a detection part or detection parts having the abnormality, information for specifying the details of abnormality to the charge management ECU 21 through the communication part 94. It may also be configured that each of the information described above may be transmitted to another ECU, or may be stored in the storage part 93.

According to the conversion device 23 as configured above, the failure determination method and the control program 98, it is possible to determine the presence/absence of a failure in various types of detection parts, located in the conversion device 23, for detecting AC/DC voltage and current. More specifically, it is possible to determine the presence/absence of a power supply fault, an open fault and a ground fault in the AC voltage detection part 90a, AC current detection part 90b, first DC voltage detection part 90c, second DC voltage detection part 90d and DC current detection part 90e as well as a failure such as sticking of the shutoff switches 3a, 3b, and also to discriminate the type of a failure.

The present embodiment as disclosed is to be construed as illustrative and not restrictive in all aspects. The scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A conversion device comprising:
an AC-DC conversion circuit;
a DC-DC conversion circuit for converting DC voltage output from the AC-DC conversion circuit;
a detection unit for detecting any of AC voltage applied to the AC-DC conversion circuit, AC current applied to the AC-DC conversion circuit, DC voltage applied to the DC-DC conversion circuit and DC current output from the DC-DC conversion circuit;
an obtaining part for obtaining information indicating whether or not AC voltage is applied to AC-DC conversion circuit; and
a power supply fault determination part for determining whether or not a power supply fault or an open fault is present in the detection unit itself if the information obtained by the obtaining part indicates that AC voltage is not applied to the AC-DC conversion circuit.

2. The conversion device according to claim 1, wherein the obtaining part is configured to obtain periodically the information indicating whether or not AC voltage is applied, and
the conversion device further comprising:
a clock part for measuring time elapsed since the obtaining part obtains the information indicating that AC voltage is applied to the AC-DC conversion circuit;
an elapsed time determination part determining whether or not elapsed time measured by the clock part is equal to or longer than a predetermined period of time; and
a first ground fault determination part determining presence or absence of a ground fault in the detection unit for detecting voltage if the elapsed time determination unit determines that the elapsed time is equal to or longer than the predetermined period of time.

3. The conversion device according to claim 2, wherein each of the AC-DC conversion circuit and the DC-DC conversion circuit is a conversion circuit of a switching system, and
the conversion device further comprising:
a switching control part controlling switching of the AC-DC conversion circuit and the DC-DC conversion circuit; and
a second ground fault determination part for determining whether or not a ground fault is present in the detection unit for detecting current in a state where switching control is performed for the AC-DC conversion circuit and the DC-DC conversion circuit.

4. The conversion device according to claim 3, wherein the detection unit comprises:
an AC current detection part for detecting AC current applied to the AC-DC conversion circuit; and
a DC current detection part for detecting DC current output from the DC-DC conversion circuit, and
the second ground fault determination part comprises:
a first determination part for determining that the AC current detection part has a ground fault if the detected AC current is less than a predetermined threshold and the detected DC current is equal to or more than the predetermined threshold; and a second determination part for determining that the DC current detection part has a ground fault if the detected DC current is less than the predetermined threshold and the detected AC current is equal to or more than the predetermined threshold.

5. The conversion device according to claim 2, wherein the detection unit comprises:

an AC voltage detection part for detecting AC voltage to be applied to the AC-DC conversion circuit; and a DC voltage detection part for detecting DC voltage to be applied to the DC-DC conversion circuit, and the first ground fault determination part compares voltage detected by each of the AC voltage detection part and DC voltage detection part with a predetermined threshold, to determine presence or absence of a ground fault in each of the detection parts.

6. The conversion device according to claim 5, further comprising:

a switch for turning on/off application of AC voltage to the AC-DC conversion circuit;

a switch control part for switching between on and off of the switch; and a switch failure determination part for determining presence or absence of a failure in the switch, based on the voltage detected by the AC voltage detection part and DC voltage detection part in a state where the switch control part controls the application of AC voltage to be off, wherein the switch control part controls the application of AC voltage to be on if the switch failure determination part determines that a failure is absent in the switch, and the first ground fault determination part determines presence or absence of a ground fault in the DC voltage detection part in a state where AC voltage is applied to the AC-DC conversion circuit.

7. The conversion device according to claim 1, being mounted in a vehicle including a battery, the conversion device performing one of operations of:

converting alternating current supplied from an external power supply into direct current by the AC-DC conversion circuit and providing the direct current output from the DC-DC conversion circuit to the battery; and converting direct current into alternating current by the AC-DC conversion circuit after converting voltage of the direct current input from the battery into another voltage by the DC-DC conversion circuit and providing the alternating current output from the AC-DC conversion circuit to a connected load.

8. The conversion device according to claim 1, wherein the detection unit comprises:

an AC voltage detection part for detecting AC voltage applied to the AC-DC conversion circuit;

an AC current detection part for detecting AC current applied to the AC-DC conversion circuit;

a DC voltage detection part for detecting DC voltage applied to the DC-DC conversion circuit; and a DC current detection part for detecting DC current output from the DC-DC conversion circuit, and the power supply fault determination part compares a detected value of each of the AC voltage detection part, AC current detection part, DC voltage detection part and DC current detection part with a predetermined threshold, to determine whether or not a power supply fault or an open fault is present in each of the detection parts.

9. A failure determination method of determining, in a conversion device including: an AC-DC conversion circuit; a DC-DC conversion circuit for converting DC voltage output from the AC-DC conversion circuit; and a detection unit for detecting any of AC voltage, AC current, DC voltage or DC current, presence or absence of a failure in the detection unit, the method comprising:

obtaining information indicating whether or not AC voltage is applied to the AC-DC conversion circuit; and determining whether or not a power supply fault or an open fault is present in the detection unit itself if the obtained information indicates that AC voltage is not applied to the AC-DC conversion circuit.

10. A non-transitory computer readable medium storing a computer program, in a conversion device including: an AC-DC conversion circuit; a DC-DC conversion circuit for converting DC voltage output from the AC-DC conversion circuit; a detection unit for detecting any of AC voltage, AC current, DC voltage and DC current; and a control circuit having a processor for controlling switching of the AC-DC conversion circuit and the DC-DC conversion circuit; causing the processor of the control circuit to determine presence or absence of a failure in the detection unit, further causing the processor to:

determine whether or not information obtained from an outside indicates that AC voltage is not applied to the AC-DC conversion circuit; and determine whether or not a power supply fault or an open fault is present in the detection unit itself if the obtained information indicates that AC voltage is not applied to the AC-DC conversion circuit.

* * * * *